United States Patent
Li et al.

(10) Patent No.: US 7,051,263 B2
(45) Date of Patent: May 23, 2006

(54) SYSTOLIC ARCHITECTURE FOR COMMA-FREE REED-SOLOMON DECODING CIRCUIT

(75) Inventors: Chi-Fang Li, Taichung Hsien (TW); Wern-Ho Sheen, Chiai Hsien (TW); Yuan-Sun Chu, Chiai Hsien (TW); Jan-Shin Ho, I-Lan Hsien (TW); Yuan-Tzu Ting, Hsinchu (TW)

(73) Assignee: Chung Shan Institute of Science and Technology, Taochun (TW)

( * ) Notice: Subject to any disclaimer, the term of this patent is extended or adjusted under 35 U.S.C. 154(b) by 722 days.

(21) Appl. No.: 10/120,536

(22) Filed: Apr. 12, 2002

(65) Prior Publication Data
US 2003/0196160 A1 Oct. 16, 2003

(51) Int. Cl.
*H03M 13/15* (2006.01)

(52) U.S. Cl. .................. 714/759; 714/775; 714/784
(58) Field of Classification Search .......... 714/759, 714/775, 784
See application file for complete search history.

(56) References Cited

U.S. PATENT DOCUMENTS

| | | | | |
|---|---|---|---|---|
| 5,630,154 A | * | 5/1997 | Bolstad et al. ............ | 712/19 |
| 6,363,060 B1 | * | 3/2002 | Sarkar ...................... | 370/342 |
| 6,504,830 B1 | * | 1/2003 | Ostberg et al. ........... | 370/342 |
| 6,587,852 B1 | * | 7/2003 | Svingen et al. ........... | 707/6 |
| 6,665,277 B1 | * | 12/2003 | Sriram ...................... | 370/324 |
| 6,675,187 B1 | * | 1/2004 | Greenberger ............. | 708/622 |
| 6,731,673 B1 | * | 5/2004 | Kotov et al. .............. | 375/145 |

* cited by examiner

*Primary Examiner*—Stephen M. Baker
(74) *Attorney, Agent, or Firm*—Birch, Stewart, Kolasch & Birch, LLP

(57) ABSTRACT

A Comma-Free Reed-Solomon decoding circuit based on systolic array architecture that applies to a cell search in a wideband code division multiple access system, and more particularly a decoding circuit that employs a systolic array in its circuit structure. The systolic array for the decoding circuit comprises an input pattern generator, a processing element array designed in the form of a systolic array and a boundary processing element array. Given the skewed-form output results required by the systolic array and generated by the input pattern generator, the processing element array makes a correlating comparison, and outputs the results of the correlating comparison to the boundary processing element, so as to acquire the decoding results required by the Comma-Free Reed-Solomon code. The results indicate the frame boundary and scrambling code groups of the cell search in a wideband code division multiple access system.

4 Claims, 6 Drawing Sheets

SYSTOLIC ARCHITECTURE FOR COMMA-FREE REED-SOLOMON DECODING CIRCUIT

FIELD OF THE INVENTION

The invention generally relates to a Comma-Free Reed-Solomon decoding circuit and method that applies to cell search in the wideband code division multiple access (W-CDMA) system, and more particularly relates to a Comma-Free Reed-Solomon decoding circuit that employs a folding systolic array circuit structure.

BACKGROUND OF THE INVENTION

For the third generation partnership project (hereinafter referred as the 3GPP) wideband code division multiple access (hereinafter referred as W-CDMA) system, the cell search process employed by a cellular phone has to execute a series of detections and testing procedures of synchronization codes in order to synchronize the cellular phone with its best base station. In general, the cell search algorithm of the 3GPP W-CDMA is divided into three ordered steps: 1) slot synchronization, 2) frame synchronization and code-group identification, and 3) scrambling-code determination. The first step involves using a primary synchronization code (hereinafter referred as PSC) to achieve slot synchronization. The second step involves using both the secondary synchronization codes (SSCs) and the Comma-Free Reed-Solomon (hereinafter referred as CFRS) codes to achieve frame synchronization and code-group identification. The third step involves using all the possible scrambling codes of the identified code group to execute a de-scrambling procedure for scrambling-code determination. Before achieving the synchronization, the cellular phone cannot begin to decode various channel messages broadcasted by the base station or measure various channel effects.

In this invention, we are concerned with that the second step of the synchronization procedure, which involves decoding the CFRS code so as to determine the frame boundary and code group. The CFRS code is a Comma-Free code and Reed-Solomon code and thus it has the features of both. The Comma-Free code has a feature that no new Comma-Free code word can be created by combining any two Comma-Free code words. It is capable of being used for both error detection and synchronization simultaneously. The synchronization capability of a Comma-Free code is used by 3GPP W-CDMA to achieve frame synchronization. Generally, a Comma-Free code decoding circuit is composed of simple correlators. However, in 3GPP W-CDMA, the Comma-Free code is transmitted intermittently as opposed to the continual transmission used in other applications. Therefore, an ordinary Comma-Free code decoder is not applicable to the synchronization procedure of 3GPP W-CDMA.

The CFRS code is a (15, 3) Reed-Solomon (hereinafter referred as RS) code with a powerful error correction capability that is essential to 3GPP W-CDMA. The design of a RS decoder has been discussed in detail in many articles, and the most widely used decoding method can be described as having four steps: 1) syndrome calculation of the received codeword, 2) error locator polynomial and error evaluator computations, 3) error location calculation, and 4) error value calculation. However, in the 3GPP W-CDMA, the set of CFRS codes is composed of 64 special RS codes and thus an ordinary RS decoder is unsuitable.

3GPP W-CDMA uses 64 CFRS codes to represent 64 code groups. Each codeword consists of 15 symbols. Every code group includes eight scrambling codes. Every base station treats one of the eight scrambling codes of the code group to which it belongs as its scrambling code for differentiating itself from the other stations. To be connected through a certain base station, a cellular phone has to achieve scrambling code synchronization with the base station first. As described above, the synchronization process has to include a decoding procedure of a CFRS code for frame boundary detection and code-group determination.

The symbols of the CFRS code are chosen from the elements of Galois Field (GF) (16). Among the 16 secondary synchronization codes transmitted via a secondary synchronization channel, an $n^{th}$ cyclic-shift synchronization code represents that the $n^{th}$ code symbol, an element of GF (16), is regarded as the first code symbol. Symbols are selected to form 64 CFRS codes to represent 64 code groups. To transmit the CFRS codes, a base station sends identical codes in each frame. However, prior to frame synchronization, the assumed initial position for the receipt of CFRS codes is not necessarily occupied by the first code symbol, but can be occupied by any one of the 15 code symbols. Since the same CFRS code is transmitted in each frame, it is possible to receive 15 code symbols continuously even before a frame boundary is determined. The consecutive received 15 code symbols correspond to a cyclic-shift version of a CFRS codeword. The aim of decoding is to identify the received codeword as one of the 64 CFRS codes in order to determine the code group, and to detect the cyclic-shift amount so as to determine the frame boundary.

According to the above description, there are 64 CFRS codes and 15 cyclic-shift versions of each codeword. Thus there can be a total of 960 (64×15) versions of cyclic-shift codeword. The evaluation of these 960 cyclic-shift hypotheses requires a lot of complicated calculations, and more importantly, timely accomplishment of these calculations in order to avoid delay in the synchronization procedure that would cause more serious problems. Hence, decoding speed has a direct impact on real-time synchronization. A "fast" CFRS decoder is an indispensable component for the cell search algorithm.

The decoding methods discussed in the existing literature regarding cell search algorithm merely involve direct comparison of these 960 versions. Thus there is no optimal decoding method, nor is there any optimal architecture for hardware implementation. Therefore, it is a good idea in implementing the direct decoding method based on the 960 versions to develop decoding hardware architecture that works optimally, as well as to put forward a decoding method that is optimal.

SUMMARY OF THE INVENTION

In view of the aforesaid technical problems, the invention provides a kind of fast decoding circuit architecture that applies to the CFRS code of 3GPP W-CDMA, not only to support various kinds of basic cell search algorithms, but also to meet the demand for multiple decoding in multi-candidate cell search algorithms.

In the cell search procedure of 3GPP W-CDMA, there are many options for an execution strategy. For example, serial execution of the three steps of the synchronization procedure, simultaneous execution of the synchronization procedure in a pipelined manner, or selecting several slot boundary candidates in step 1 and simultaneously executing steps 2 & 3 by means of the various slot boundary candidates are all possible and feasible. Each algorithm produces different CFRS decoding speed. Serial cell search does not produce fast decoding. Pipelined cell search produces a decoder with high decoding speed. The multi-candidate method produces a decoder with extremely high decoding speed meeting the need for frequent decoding. The invention provides the means to provide all of the aforesaid arrangements, i.e., providing decoding circuits that work at high or low decoding speeds. Whenever a high decoding speed is required, it meets the decoder requirements of the cell search algorithm. Whenever a low decoding speed is acceptable, it executes decoding with the minimal number of components so as to reduce power consumption.

Another object of the invention is to provide a kind of folding systolic array (SA) architecture for a CFRS decoding circuit. This kind of architecture is able to perform speedy real-time execution of decoding for synchronization.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 1:
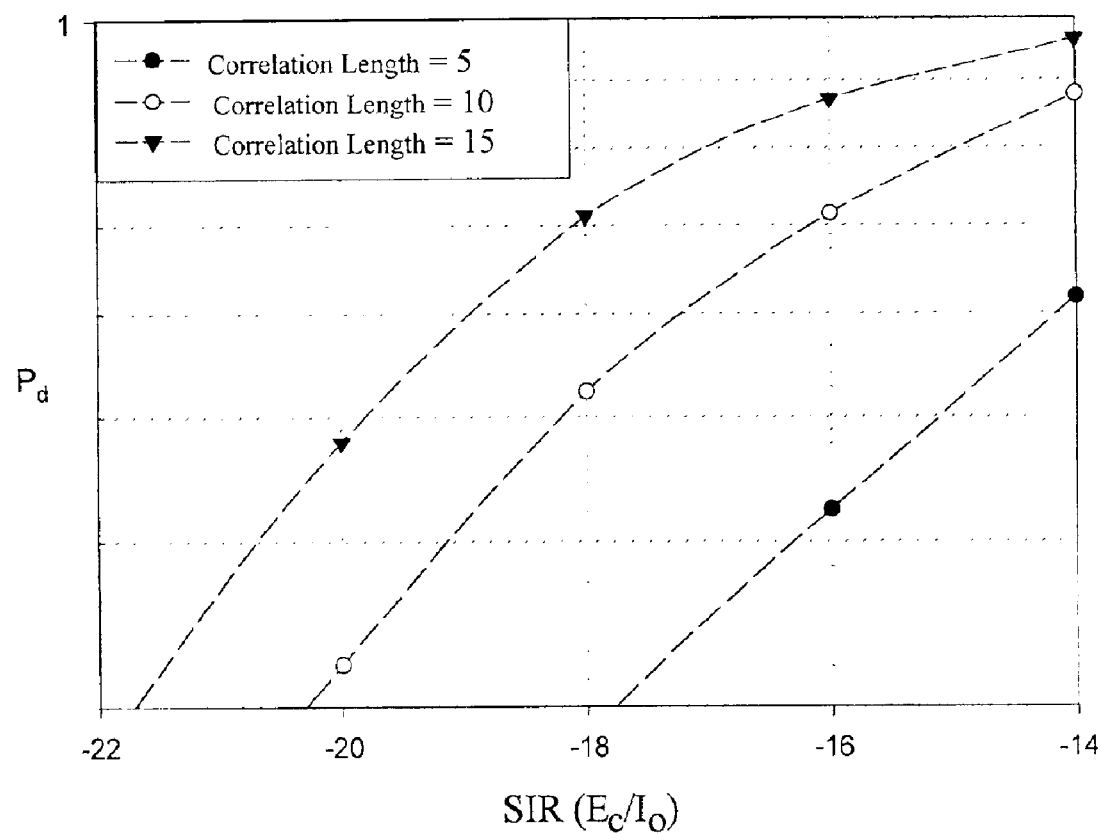
FIG. 1 depicts the comparison of the efficiency of CFRS decoding with different decoding lengths.

As shown in FIG. 1, the 960 versions of CFRS codes can be decoded better with a complete set of 15 code symbols rather than with part of the code symbols. Hence, in the invention, after 15 code symbols have been received, a frame boundary is determined by making reference to a direct comparison of the 15 code symbols.

In order to achieve the objects of the invention, the decoding method adopted by the SA architecture decoding circuit put forward by the invention can be denoted in the following way:

$$(i, j) = \text{Arg}\{\max\{X_i \otimes H_j\}_{j=0\sim63}^{i=0\sim14}\}, \quad (1)$$

where i denotes the index for the 15 cyclic-shift versions of $X_i$, j denotes the index for the 64 CFRS codes, $X_i$ denotes the result of i time(s) of rightward cyclic-shift of the received CFRS codeword, while $X_0$ denotes the result of arbitrary cyclic-shift of the CFRS codes received in the beginning; and, $X_i = \{x_1, x_2, X_3, \ldots, x_{15}\}$, $x_k \in GF(16), 1 \leq k \leq 15$. $H_j$ denotes one of the 64 CFRS codes, and $H_j = \{h_1, h_2, h_3, \ldots, h_{15}\}$, $h_k \in GF(16), 1 \leq k \leq 15$. Finally, $X_i \hat{x} H_j$ refers to making a correlating comparison.

Explanation of the SA architecture decoding circuit put forward by the invention is provided below.

Figure 2:
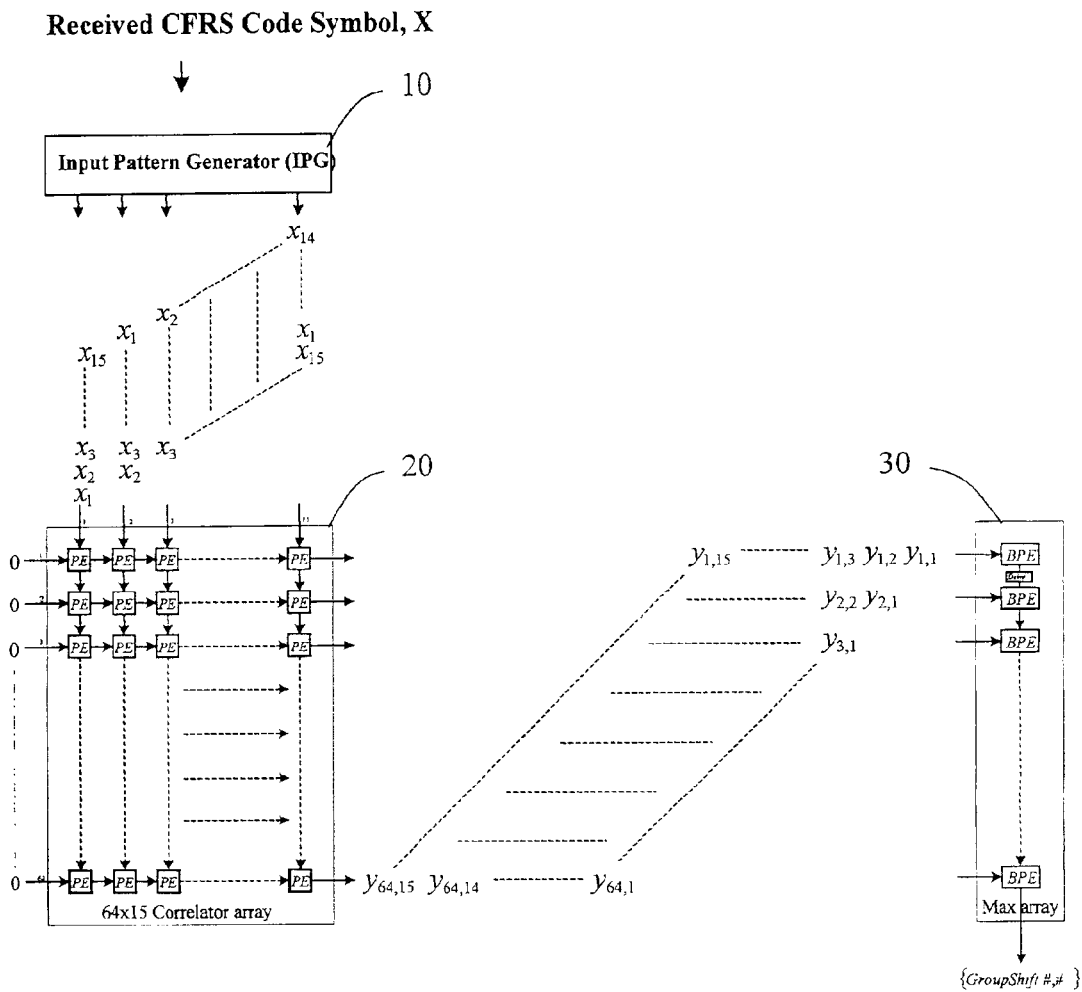
FIG. 2 shows a CFRS decoder based on the SA architecture, wherein $x_i$ denotes the received code symbol and $y_{ij}$ denotes the result of a correlating comparison.

As shown in FIG. 2, the decoding circuit comprises several components, namely an Input Pattern Generator (IPG) 10, a 64×15 Processing Element Array (PEA) 20, and a 64×1 Boundary Processing Element Array (BPEA) 30.

Figure 3:
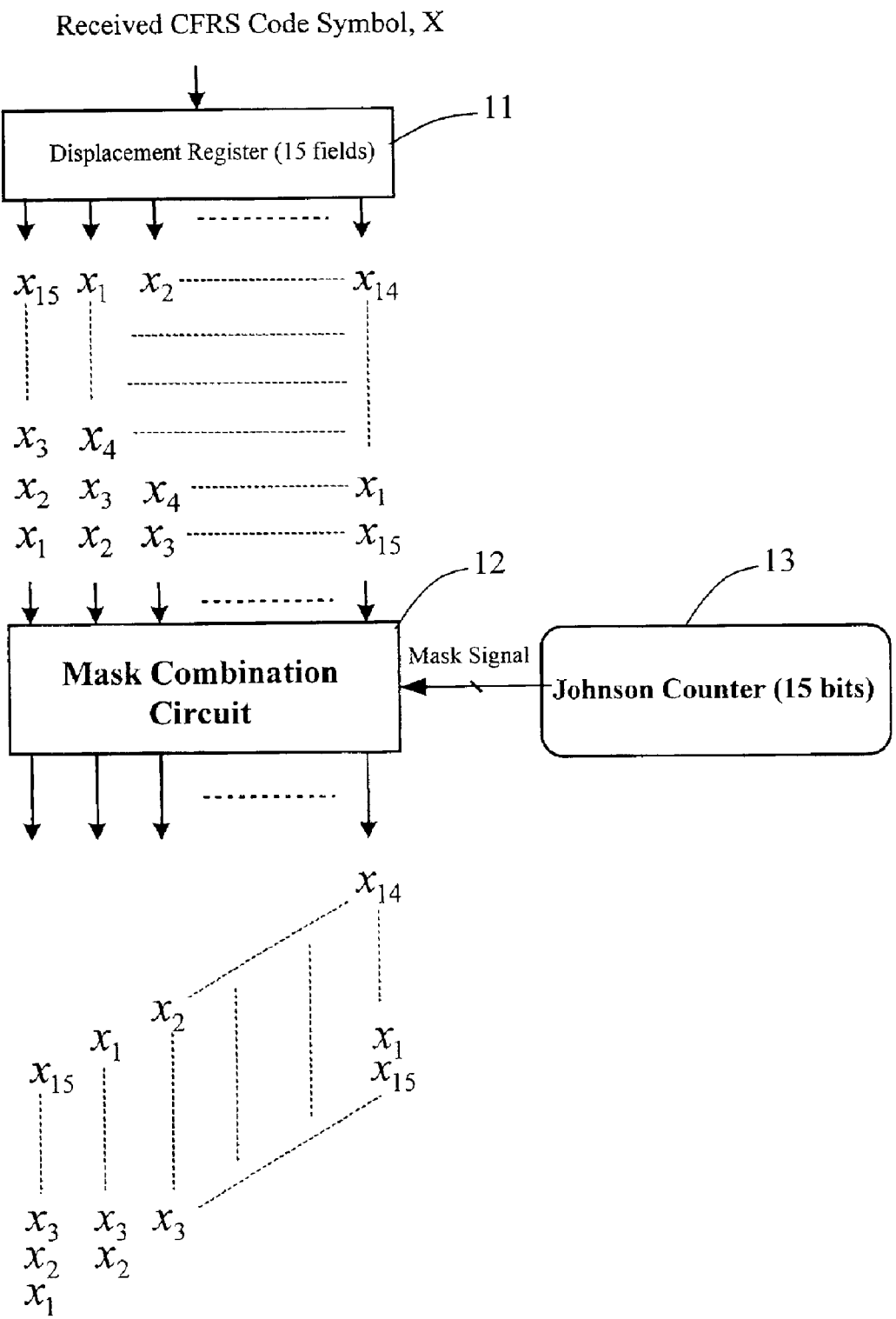
FIG. 3 depicts the structure of IPG.

The main function of the IPG 10 is to generate 15 cyclic-shift versions from the arbitrary cyclic-shift version CFRS codes received, X, wherein $X_i, 0 \leq i \leq 14$, then output these cyclic-shift versions to PEA 20 in a skewed form required by the SA architecture such that the output comprises all 15 types of cyclic-shift X, and, as shown in FIG. 3, its circuit structure comprises a shift register 11, a Johnson counter 13, and a masking combinational circuit 12. Its process is described below.

First of all, a received code, X, is loaded to the shift register 11. The shift register 11 then generates its 15 versions of cyclic-shift separately. The Johnson counter 13 generates the required skewed mask. With the masking combinational circuit 12, the 15 cyclic-shift versions are turned into the required 15 cyclic-shift versions in skewed form. The skewed 15 cyclic-shift versions of X are input to the underlying WPEA 20 that is based on a SA architecture.

Figure 4:
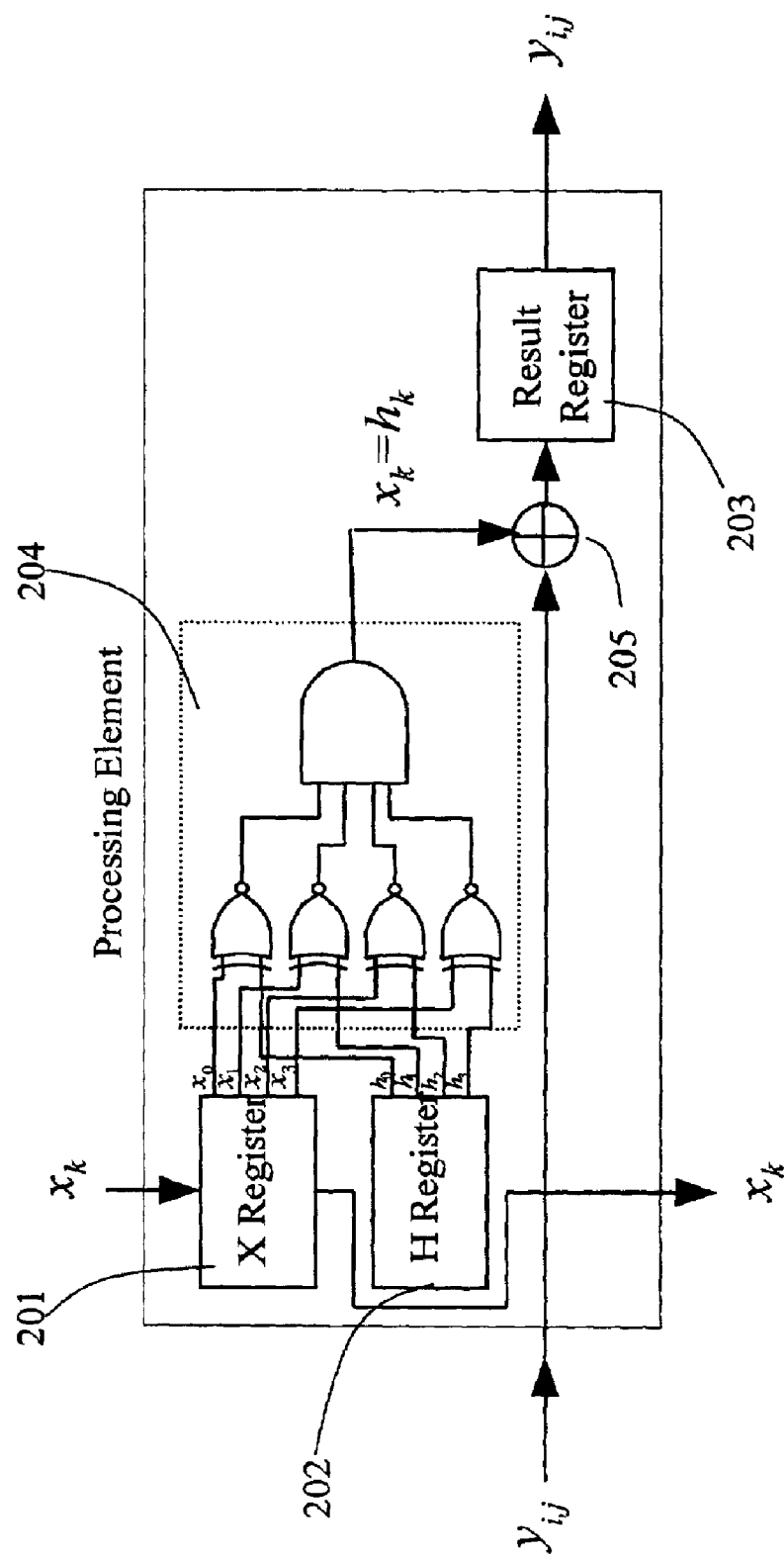
FIG. 4 depicts the circuit of PE.
Figure 5:
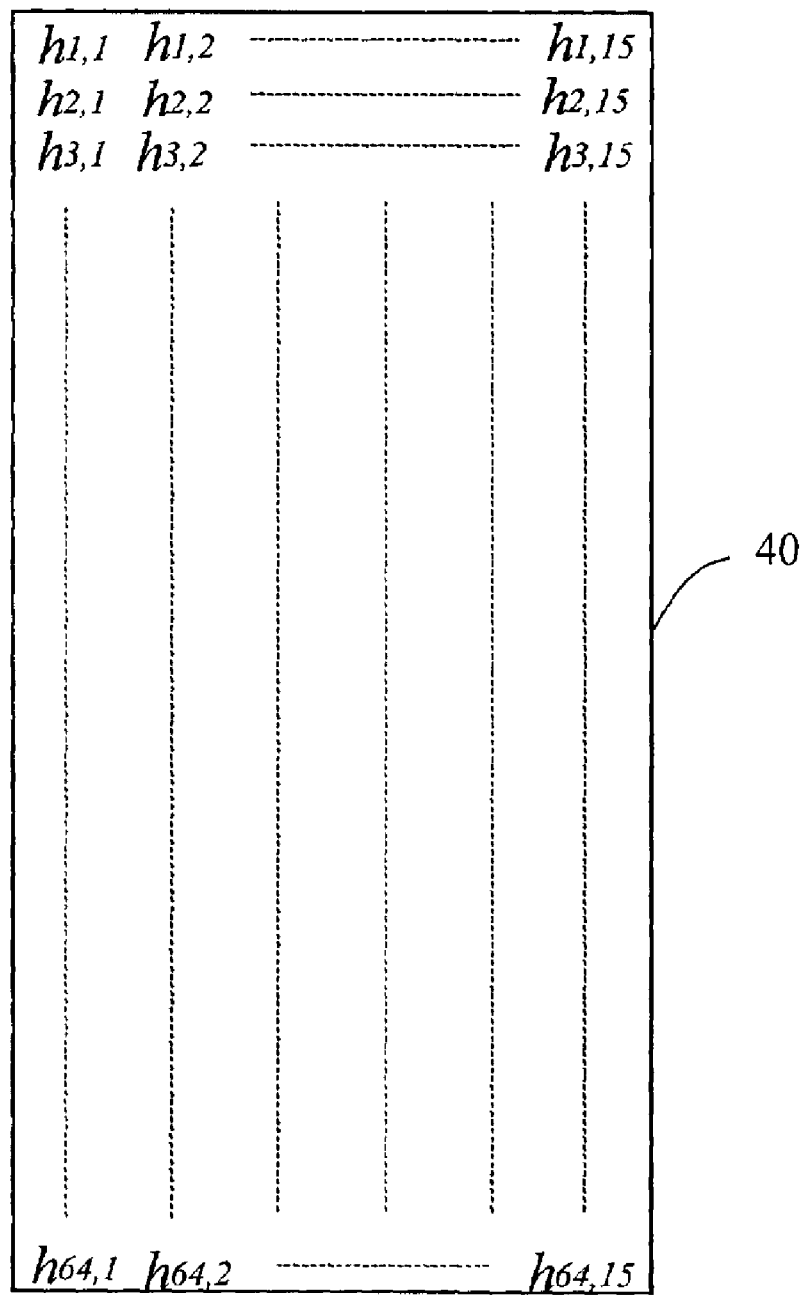
FIG. 5 shows the table of 64 sets of CFRS codes.

The PEA 20 is a kind of SA architecture composed of 64×15 PEs. The structure of each PE is shown in FIG. 4, and the primary function of the PE is to make a correlating comparison. IPG 10 generates all the 15 cyclic-shift versions that are then compared with 64 sets of CFRS codes for correlations. There are three registers in each PE:, H register 202, X register 201 and Y register 203. The H register 202 is for storing the code symbols, $h_k$, of CFRS code beforehand, or, in other words, the 64×15 CFRS code symbols table 40 shown in FIG. 5 is put in the H register 202 of every PE of the 64×15 PEA 20. Since there are 64 CFRS codes, and each code word consists of 15 code symbols, without folding, the 15 versions needs to be processed by a 64×15 PEA 20. The X register 201 is for storing the code symbols, $x_k$, sent by the overhead PE. Given the comparing combinational circuit 204 shown in FIG. 4, when the two code symbols stored in the X register 201 and the H register 202, respectively, are identical, an accumulator 205 accumulates the result of the correlating comparison and stores the result in the Y register 203 first. It then sends the result to the PE on its right and sends the received code symbols $x_k$ to the underlying PE.

Figure 6:
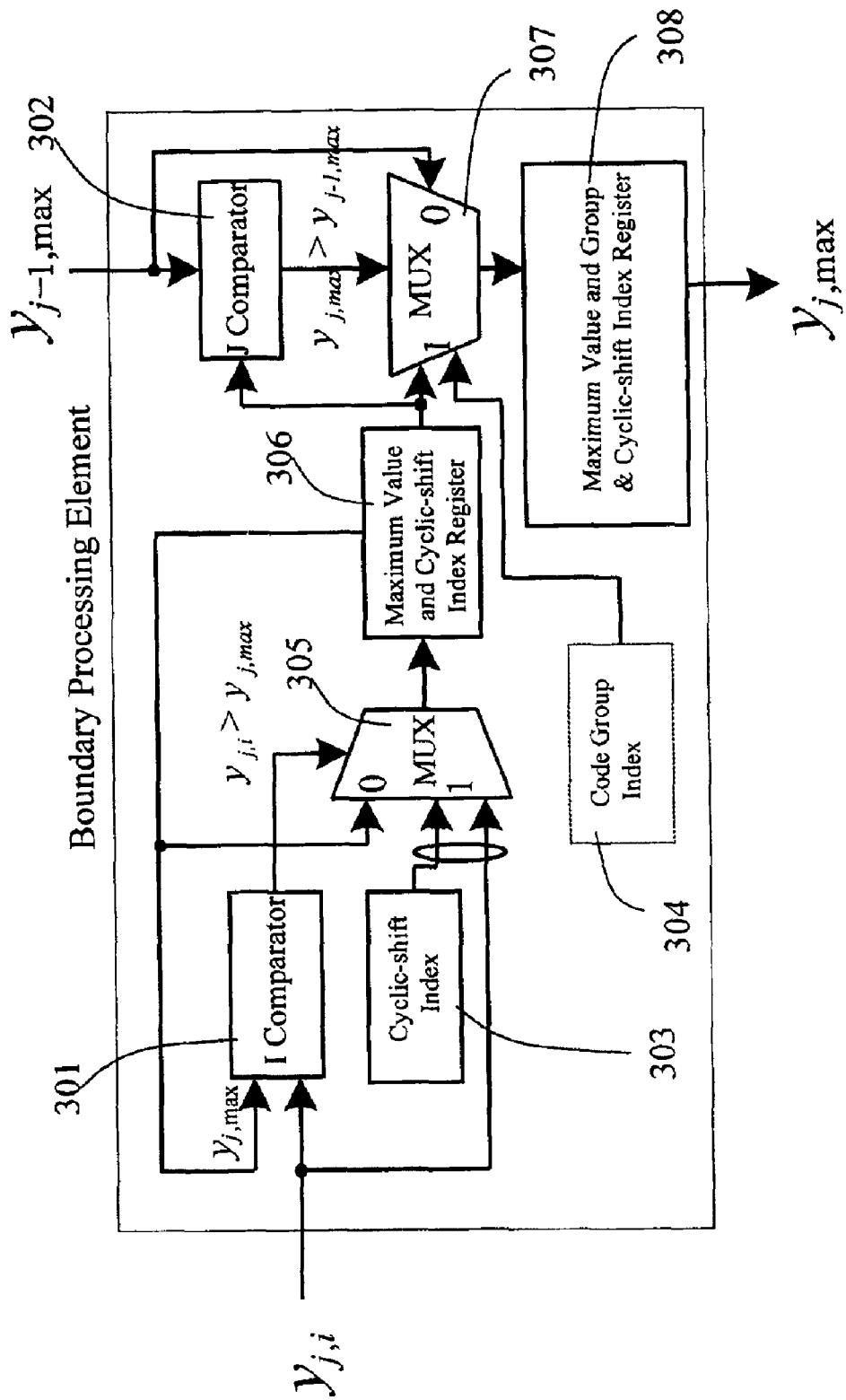
FIG. 6 depicts the circuit of BPE.

The 64×15 PEA 20 connects to a 64×1 BPEA 30 that lies on its right. Each row of the PEA 20 is in charge of making the correlating comparison with a particular CFRS code word. The last PE output of each row is the result of correlating comparison, $y_{j,j}$. BPE compares this set of comparison results, $y_{j,j}$, for i=0~14. After comparing the 15 cyclic-shift results of the same codeword, each BPE begins to compare the results of individual rows as shown in FIG. 6.

The I comparator 301 is for comparing the results of the same row. A result that is greater is stored in the maximum value and cyclic-shift index register 306 first. After the maximum result of the same row has been generated, the J comparator 302 begins to compare the maximum value of the existing row with that of the overhead row. It selects the greater one, saves it and its code group index j and cyclic-shift index i in the maximum value and group & cyclic-shift index register 308, and sends them to the underlying BPE. The multiplexer 305 makes reference to the result of the I comparator 301, and saves the greater result value, $y_{ji}$, and its cyclic-shift index i in the maximum value and cyclic-shift index register 306. In the event that the new $y_{ji}$ value is greater than the $y_{j,max}$ value, that is, when the multiplexer 305 chooses line 1, then its cyclic-shift index i is provided by the cyclic-shift index 303. The multiplexer 307 makes reference to the result of J comparator 302, and saves the greater result value, $y_{j,i}$, its cyclic-shift index i and code group index j, etc., in the maximum value and group & cyclic-shift index register 308. In the event that the result of the existing row, $y_{j,max}$, is greater than the $y_{j-1,max}$ value of the overhead row, then its group index is provided by the code group index 304.

The output of the BPE at the bottom (that is, the output result of the maximum value and group & cyclic-shift index register 308) is the result of decoding. The comparison result indicating the greatest correlation is the desired decoding result. The code group index j of this result denotes that the received CFRS code, X, is the $j^{th}$ code of all the possible 64 CFRS codes, while the cyclic-shift index i denotes that the received CFRS code, X, results from i symbols of cyclic-shift of the original code symbol. As described in the "Background of the Invention" section of this document, in 3GPP W-CDMA, the code group index, j, denotes a code group, while the cyclic-shift index, i, denotes a frame boundary. This is the end of step 2 of the cell search.

Referring to FIG. 2 again, the whole decoding procedure is: load the CFRS codes received to IPG 10; the IPG 10 generates 15 versions of cyclic-shift in order; input the 15 of cyclic-shift in skewed style to the 64×15 PEA 20; the PEA 20 makes a correlating comparison between the 15 types of cyclic-shift and 64 sets of codes saved beforehand; a comparison is made on each row with respect to one possible CFRS codes; for the comparison result of a row, the BPE of the row identifies the most probable cyclic-shift; search vertically, that is, from the top to the bottom, and find the greatest correlation result of cyclic-shift of individual rows; the output of the BPE at the bottom is the decoding result.

The decoding duration required by this decoding circuit is as follows: (Please refer to the aforesaid decoding process) 15 cycles after the IPG 10 has input the skewed-form cyclic-shift versions into the PEA 20, the first correlating comparison result of the first row is generated; 14 cycles later, the last correlating comparison result of the first row is generated; one cycle later, the most possible cyclic-shift version of the first row is generated and, meanwhile, the last correlating comparison result of the second row has been generated, thus the BPE of the second row only generates the most probable cyclic-shift of the second row and begins to compare the results of individual rows vertically after one more cycle. It takes 63 cycles to generate the final result. Therefore, a total of 15+14+1+1+63=94 cycles is required to finish decoding. The length of each cycle varies according to the implementation method.

From the point of view of a system, the chip rate is 3.84 MHz. In general, the minimum frequency designed by a circuit should be 3.84 MHz. In other words, the designed circuit only spends time for a maximum 94 chips on decoding. Thus, there is sufficient time to prepare for the following step of determining scrambling codes in an ordinary synchronization procedure. Even if decoding has to be executed ten or twenty times in multi-candidate cell search algorithms, this decoder is able to finish decoding before the end of the slot wherein the $15^{th}$ secondary synchronization code is decoded. Thus it does not delay the execution of step 3 of the cell search procedure. The total time spent: 20 (number of times of decoding) * 94 (the duration of decoding) +256 (receipt of the secondary synchronization code)=2136<2560 (slot length).

While the invention has been described by way of example and in terms of a preferred embodiment, it is to be understood that the invention is not limited thereto. It should be understood that the detailed description and specific examples, while indicating preferred embodiments of the invention, are given by way of illustration only, since various changes and modifications within the spirit and scope of the invention will become apparent to those skilled in the art from this detailed description. Therefore the scope of protection for the invention should conform to the claims attached below.

What is claimed is:

1. A systolic architecture for Comma-Free Reed-Solomon decoding circuit, which receives and decodes a Comma-Free Reed-Solomon (CFRS) code, comprising:

an input pattern generator, which receives arbitrarily cyclic-shifted CFRS codes for generating 15 cyclic-shift versions of the CFRS codes for output to a systolic array in a skewed form;

a processing element array composed of 64×15 processing elements, for receiving the skewed-form cyclic-shift CFRS code words to make a series of correlating comparisons and output a series of correlating comparison results; and a boundary processing element array composed of 64×1 boundary processing elements, for calculating a greatest of said correlating comparison results of a row of said systolic array to find greatest results of all rows and set an associated index as a decoding result.

2. The systolic architecture for Comma-Free Reed-Solomon decoding circuit of claim 1, wherein said input pattern generator is composed of a cyclic-shift register, a Johnson counter and a masking combinational circuit;

said cyclic-shift register receives the 15 symbols of said CFRS codes, cyclically shifts them and outputs them as 15 cyclic-shift versions of said CFRS codes;

said Johnson counter sends a masking signal to said masking combinational circuit;

said masking combinational circuit outputs the skewed-form CFRS codes according to said masking signal.

3. The systolic architecture for Comma-Free Reed-Solomon decoding circuit of claim 1, wherein each of said processing elements of said 64×15 processing elements is composed of a first register, a second register, a third register, a XNOR-AND combinational circuit and an accumulator;

said first register stores reference symbols of the CFRS codes beforehand;

said second register stores the received code symbols of CFRS codes to facilitate their further processing;

said third register stores said correlating comparison results;

said (XNOR-AND) combinational circuit compares two code symbols in said first register and said second register, respectively, to see whether they are identical;

said accumulator adds a comparison result to a final result.

4. The systolic architecture for Comma-Free Reed-Solomon decoding circuit of claim 1, wherein each of said boundary processing elements is composed of a first comparator, a second comparator and a combinational circuit;

said first comparator compares the comparison results of the same row, while said second comparator compares the comparison results of all rows;

said combinational circuit stores temporary results of said first comparator and those of said second comparator, and sends the comparison result of the row to said second comparator for comparison after said first comparator has made a comparison with respect to the row.

* * * * *